US006599814B1

(12) United States Patent
Vanhaelemeersch et al.

(10) Patent No.: US 6,599,814 B1
(45) Date of Patent: Jul. 29, 2003

(54) METHOD FOR REMOVAL OF SIC

(75) Inventors: Serge Vanhaelemeersch, Leuven (BE); Herman Meynen, Linden (BE); Philip D. Dembowski, Midland, MI (US)

(73) Assignees: Interuniversitair Microelektronica Centrum (IMEC) (BE); Dow3Corning corporation, Midland, MI (US)

( * ) Notice: Subject to any disclaimer, the term of this patent is extended or adjusted under 35 U.S.C. 154(b) by 0 days.

(21) Appl. No.: 09/980,769

(22) PCT Filed: Apr. 28, 2000

(86) PCT No.: PCT/BE00/00045
§ 371 (c)(1),
(2), (4) Date: Feb. 19, 2002

(87) PCT Pub. No.: WO00/67304
PCT Pub. Date: Nov. 9, 2000

Related U.S. Application Data

(60) Provisional application No. 60/132,284, filed on May 3, 1999.

(51) Int. Cl.[7] .............................................. H01L 21/76
(52) U.S. Cl. ........................................ 438/431; 438/931
(58) Field of Search .................................. 438/431, 931

(56) References Cited

U.S. PATENT DOCUMENTS

| 4,865,685 | A | * | 9/1989 | Palmour | 156/643 |
| 4,948,461 | A | | 8/1990 | Chatterjee | |
| 4,981,551 | A | * | 1/1991 | Palmour | 156/643 |
| 5,436,174 | A | * | 7/1995 | Baliga et al. | 438/705 |
| 5,571,374 | A | * | 11/1996 | Thero et al. | 156/643.1 |
| 5,818,071 | A | | 10/1998 | Loboda et al. | |

FOREIGN PATENT DOCUMENTS

| EP | 06314791 | 8/1994 |
| EP | 0725440 A3 | 8/1996 |
| EP | 0725440 A2 | 8/1996 |
| EP | 0845803 A1 | 6/1998 |

OTHER PUBLICATIONS

Ninomiya et al., "Chemical Etching of Thermally–Grown $SiO_2$ Films on SiC Studied by Spectroscopic Ellipsometry," Japanese Journal of Applied Physics, Vo. 33 (1994), Apr., No. 4A, Part 1, Tokyo, JP.

Chappel et al., "High frequency CV characteristics of plasma oxidised silicon carbide," Electronics Letters, Jan. 2, 1997, vol. 33, No. 1.

Munch et al., Thermal Oxidation and Electroytic Etching of Silicon Carbide, Institut A fur Werkstoffkunde, Technische Universitat, Hannover, Germany.

Wolf et al., "Reactive Ion Etching of 6H–SiC in $SF_6/O_2$ with $N_2$ Additive for Device Fabrication," J. Electrochem So., vol. 143, No. 3, Msrch 1996.

* cited by examiner

Primary Examiner—David Nelms
Assistant Examiner—Thao P Le
(74) Attorney, Agent, or Firm—Jones Day

(57) ABSTRACT

The present invention is related to a method for removal of silicon carbide layers and in particular amorphous SiC of a substrate. Initially, the exposed part of a carbide-silicon layer is at least partly converted into an oxide-silicon layer by exposing the carbide-silicon layer to an oxygen containing plasma. The oxide-silicon layer is then removed from the substrate.

19 Claims, 3 Drawing Sheets

Step a)

Step b)

Step c) and d)

METHOD FOR REMOVAL OF SIC

CROSS REFERENCES TO RELATED APPLICATIONS

The present application is a U.S. national stage filing under 35 USC 371 and claims priority from PCT Application No. PCT/BE/00/00045, entitled "METHOD FOR REMOVAL OF SIC," filed on Apr. 28, 2000, currently pending, which claims priority from U.S. Provisional Patent Application No. 60/132,284 also entitled "METHOD FOR REMOVAL OF SIC," filed on May 3, 1999. The above identified applications are incorporated by reference in their entirety.

FIELD OF THE INVENTION

The present invention is related to a method for removal of silicon carbide layers and in particular amorphous SiC of a substrate.

The present invention is also related to an integrated circuit implementing said method.

BACKGROUND OF THE INVENTION

SiC (Silicon Carbide), particularly amorphous SiC, is known as a chemically very stable component. In semiconductor processing, many modules, defined as a set of subsequent basic steps, require the presence of a thin layer which remains substantially unaffected by the operation being performed, i.e. so-called semi-inert layers. Particularly, such a semi-inert layer can be used as a hard mask layer during dry etch, or as an etch stop layer during wet/dry etch, or as stopping layer for a Chemical-Mechanical polishing process (CMP) or for many other applications. For instance, these semi-inert layers can also be used as diffusion barrier layers. Due to it's high chemical stability, the use of a SiC layer as a semi-inert layer may have benefits over other materials such as silicon dioxide and silicon nitride, especially for those applications where selectivity to the operation being performed is of high importance for successful implementation. In addition, SiC layers may be superior in terms of barrier properties.

Document U.S. Pat. No. 5,818,071 is related to interconnect structures incorporating a silicon carbide layer as a diffusion barrier layer particularly between a dielectric and a highly conductive metal layer with a resistivity less than about 2.5 microhm-centimetres. Document U.S. Pat. No. 5,818,071 does not disclose the use of a silicon carbide layer as an etch stop layer and a diffusion barrier layer in pre-metal dielectric structures, particularly between a silicide layer and a dielectric. U.S. Pat. No. 5,818,071 does not disclose how to pattern or to remove the silicon carbide layer selectively to the underlying layer, in casu a metal layer.

Although a silicon carbide layer is a very attractive layer to use in semiconductor processing and particularly in interconnect structures and dielectric structures, its high chemical stability can also be fits biggest disadvantage. SiC suffers from the fact that it is very difficult (if not impossible at all) to remove and particularly to remove it selectively. Some examples of process flows where such removal is required are: the stopping layers in the CMP operations for definition of field area's using the shallow trench isolation approach; and the use as etch stop layers for contact and via definition, where the process flow requires the selective removal of the etch stop layer at the bottom of the contact/via to obtain low contact/via resistance. Another example is also related to the use of SiC as a stopping layer in CMP applications. The cleaning after CMP usually relies on under-etching of the particles/residues. This requires that the surface from which particles and/or residues need to be removed can be etched isotropically in a very controlled way. However, due to the high chemical stability of SiC, particles and/or residues on top of the SiC layer can not be under-etched and therefore, cleaning becomes rather difficult.

Document EP-A-0845803 discloses the removal of a surface portion of a crystalline SiC film. First, defects are introduced in the top layer, thereafter, the top layer is converted into a silicon oxide layer by a thermal oxidation treatment typically at a temperature of 1100° C. This renders this process unsuited for use in interconnect structures and pre-metal dielectric (PMD) structures because active devices are already defined and therefore only limited thermal treatments can be applied, i.e. typically 600° C. or below. Moreover, the silicide layers in the PMD structures, are also not compatible with temperatures above 650° C., while most metal features in the interconnect structures are not compatible with temperatures typically above about 400° C.

AIMS OF THE INVENTION

It is an aim of the invention to remove exposed layers of a SiC layer by converting at least a major part of said SiC layer in silicon (di)oxide or silicon oxide based layers. Particularly this conversion is performed at low temperatures, preferably 600° C. or below, in an oxygen-containing plasma. Thereafter the converted part of said SiC layer is removed.

It is a further aim of the invention to provide a method for fabricating an interconnect structures, including PMD structures, using SiC as etch stop layer and/or diffusion barrier layer by using the afore-mentioned method for in-situ selective removal of exposed layers of the SiC layer.

It is still a further aim of the invention to provide an interconnect structure, particularly a PMD structure wherein a SiC layer can be used as an etch stop layer between a conductive layer and the surrounding dielectric.

SUMMARY OF THE INVENTION

This invention is about the selective removal of exposed layers of SiC layers which allows the use of this highly chemically stable material for a wide range of applications. At least for the purpose of this disclosure a carbide-silicon layer is an insulating layer being composed of at least Si and C, e.g., but not limited hereto, SiC, or at least Si, C and O, e.g. silicon oxycarbide, or at least Si, C and N, e.g. nitrided silicon carbide (SiNC) or at least Si, N, O and C, e.g. nitrided silicon oxycarbide (SiNOC), or at least Si, C and H e.g. amorphous hydrogenated silicon carbide (SiC:H), or at least Si, C, N and H, e.g. hydrogenated SiNC, or at least Si, O, C, N and H, e.g. hydrogenated SINOC. For the purpose of this disclosure, an oxide-silicon layer is a layer composed of at least Si and O, e.g. silicon (di)oxide, or of Si, O and a smaller fraction of C and/or a smaller fraction of N and/or a smaller fraction of H, for example silicon (di)oxide wherein the fraction of C and/or N and/or H smaller is than the fraction of O.

In an aspect of the invention, a method for removing at least partly an exposed part of a carbide-silicon layer formed on a substrate is disclosed comprising the steps of:

converting at least paritly said exposed part of said carbide-silicon layer into an oxide-silicon layer by exposing said carbide-silicon layer to an oxygen containing plasma, removing said oxide-silicon layer from said substrate.

Said exposed part can be, but is not limited hereto, an exposed part in an opening or can De at least an exposed part of a layer.

This method can be applied in-situ. The substrate can be, but is not limited hereto, a partly processed or a pristine wafer or slice of a semi-conductive material, like Si or Ga As or Ge, or an insulating material, e.g. a glass slice, or a conductive material. Said substrate can comprise a patterned conductive layer. Particularly, in case said substrate is a partly processed wafer or slice; at least a part of the active and/or passive devices can already be formed and/or at least a part of the structures interconnecting these devices can be formed.

For the purpose of this disclosure, plasma should be understood as a conventional plasma such as a reactive ion etch (RIE) plasma or a chemical vapour deposition (CVD) plasma, or a plasma afterglow. By exposing said carbide-silicon layer to an oxygen-containing plasma, energy is given to the oxygen containing species, such that carbide-silicon is at least partly converted into oxide-silicon. This energy can be e.g. thermal energy or kinetic energy, e.g. by the formation of ions.

In an embodiment of the invention, a method as recited in the first aspect of this invention is disclosed, wherein said conversion step and said removal step are subsequently repeated for a number of times until said carbide-silicon layer is substantially removed.

In an embodiment of the invention, the conversion from a part of the carbide-silicon laver to an oxide-silicon layer can be performed by exposing the carbide-silicon layer to an oxygen-containing reactive ion etch (RIE) plasma. Particularly, the substrate including the carbide-silicon layer can be introduced in a pressurised chamber of a plasma-etch tool. The pressure can be lower than 3 Torr and preferably between 1 mTorr and 1 Torr. The temperature in said chamber can be 300° C. or below; or preferably below 100° C. This temperature can also be in the range from −20° C. to 100° C. Preferably, said temperature is about room temperature. The energy of the RIE plasma can be between 1 eV and 500 eV, such that ionic species can be formed.

In another embodiment, the conversion from a part of the carbide-silicon layer to an oxide-silicon layer can be performed by exposing the carbide-silicon layer to an oxygen-containing CVD plasma. The substrate including the carbide-silicon layer can be introduced in a pressurised chamber of a chemical vapour deposition tool. The pressure can be, but is not limited hereto, higher than 5 Torr, e.g. 10 Torr. The temperature can be in the range between 250° C. and 550° C., preferably in the range between 350° C. and 500° C.

In yet another embodiment of the invention, the conversion from a part of the carbide-silicon layer to an oxide-silicon layer can be performed by exposing the carbide-silicon layer to an oxygen-containing plasma afterglow. Particularly, the substrate including the carbide-silicon layer can be introduced in a pressurised chamber of a plasma tool. Said plasma afterglow can be characterised, but is not limited hereto, by a pressure in the range from 0.02 Torr to 3 Torr, and in the range between 0.2 Torr and 1.5 Torr and preferably between 0.75 Torr and 1.25 Torr, e.g. about 0.85 Torr or about 1.1 Torr. The flow of the oxygen containing substance can be lower than 10000 Sccm and preferably, but not limited hereto, about 4000 Sccm.

The temperature in said chamber is preferably 600° C. or below. This temperature can also be in the range from 100 to 600° C. and also in the range from 200 to 400° C. and also in the range from 200 to 300° C. This temperature is preferably, but not limited hereto, about 230° C.

In another aspect of the invention, an integrated circuit on a substrate with at least one conductive layer being partly exposed is disclosed, said circuit comprising:

a conductive layer deposited on a semiconducting layer, at least one dielectric layer having at least one opening extending through said dielectric layer to expose at least a part of said conductive layer, a carbide-silicon layer being formed at least on said conductive layer and being positioned between said dielectric layer and said conductive layer adjacent to said exposed part of said conductive layer.

Said conductive layer can be a pure metal or a metal alloy of the group of metals consisting of Al, Cu, W, Pt, Ag, Ni, Au, Co, Ti, Ta; or a Si-containing or other semiconductor-containing layer such as, but not limited hereto, e.g. a silicide, a polysilicon or a silicon layer. Said semiconducting layer can be a silicon containing layer, a GaAs layer, a Ge layer or a SiGe layer. Said dielectric layer has preferably a dielectric constant of less than about 4.

In an embodiment the invention an integrated circuit comprising an interconnect structure on a substrate having a surface with at least one exposed Si-containing layer, particularly a PMD structure, is disclosed. This interconnect structure further comprises:

a conformal silicide layer on said exposed Si-containing layer;

at least one dielectric layer on said surface of said substrate having at least one opening, said opening extending through said dielectric layer to thereby define an exposed part of said silicide layer; and a carbide-silicon layer being formed at least on said silicide layer and being positioned between said dielectric layer and said silicide layer adjacent to said exposed part of said silicide layer.

A silicide layer can be a compound comprising silicon and at least one of the group comprising Co, Ti, Ta, Co, Mb, Ni, Pt and W.

In yet a further aspect of the invention, a method for fabricating an integrated circuit on a substrate having a surface with at least one conductive layer on a semiconducting layer is disclosed. This conductive layer can be a pure metal or a metal alloy of the group of metals consisting of Al, Cu, W, Pt, Ag, Ni, Au, Co, Ti, Ta; or a Si-containing or other semiconductor-containing layer such as, but not limited hereto, e.g. a silicide, a polysilicon or a silicon layer.

This method comprises the steps of:

forming a carbide-silicon layer at least on said conductive layer;

depositing at least one dielectric layer on said surface and on said carbide-silicon layer;

forming at least one opening in said dielectric layer extending through said dielectric layer to thereby expose a part of said carbide-silicon layer formed on said conductive layer;

in-situ converting said exposed part of said carbide-silicon layer in said opening into a oxide-silicon layer by exposing said exposed part of said carbide-silicon layer in said opening to an oxygen-containing plasma; and removing said oxide-silicon layer in said opening.

Said conversion step and said removal step can subsequently be repeated for a number or times until at least a part of said conductive layer is exposed.

SHORT DESCRIPTION OF THE DRAWINGS

FIG. 1 depicts ellipsometric measurements performed on two different amorphous hydrogenated silicon carbide layers being a layer of 20 nm (2) and a layer of 50 nm (1) at different time periods being before (partly) conversion to a oxide-silicon layer (3) according to an embodiment of the invention, from the onset of this conversion (3) till the removal of the converted part (4), and after the removal of the oxide-silicon layer (5).

DETAILED DESCRIPTION OF THE INVENTION

Figure 1:
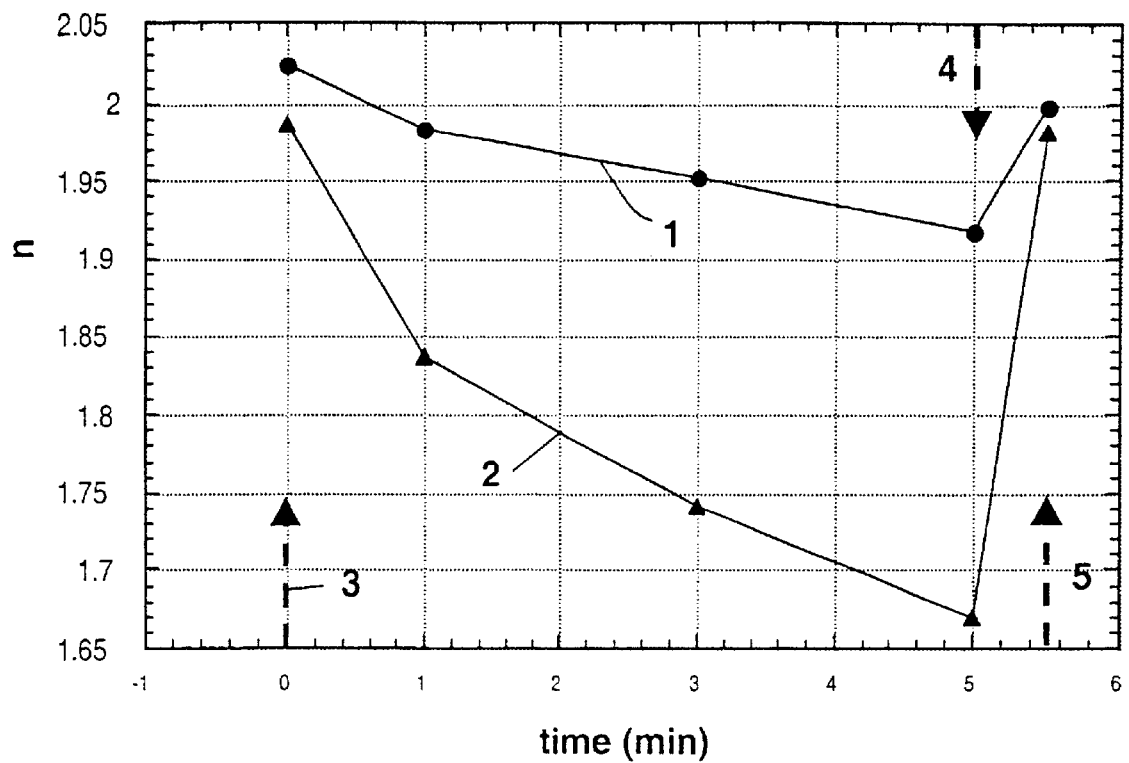

In relation to the appended drawings the present invention is described in details in the sequel. It is apparent however that a person skilled in the art can imagine several other equivalent embodiments or other ways of executing the present invention, the spirit and scope of the present invention being limited only by the terms of the appended claims.

At least for the purpose of this disclosure a carbide-silicon layer is an insulating layer being composed of at least Si and C, e.g., but not limited hereto, SiC, or at least Si, C and O, e.g. silicon oxycarbide, or at least Si, C and N, e.g. nitrided silicon carbide (SINC) or at least SI, N, O and C, e.g. nitrided silicon oxycarbide (SINOC); or at least Si, C and H e.g. amorphous hydrogenated silicon carbide (SiC:H), or at least Si, C, N and H, e.g. hydrogenated SiNC, or at least Si, O, C, N and H, e.g. hydrogenated SiNOC. For the purpose of this disclosure, an oxide-silicon layer is a layer composed of at least Si and O, e.g. silicon (di)oxide, or of Si, O and a smaller fraction of C and/or a smaller fraction of N and/or a smaller fraction of H, for example silicon (di)oxide wherein the fraction of C and/or N and/or H smaller is than the fraction of O. Said oxide-silicon layer comprises at least one of the group consisting of silicon dioxide, silicon dioxide with a smaller fraction of C, silicon dioxide with a smaller fraction of N and C, silicon dioxide with a smaller fraction of N, hydrogenated silicon dioxide, hydrogenated silicon dioxide with a smaller fraction of C, hydrogenated silicon dioxide with a smaller fraction of N and C and hydrogenated silicon dioxide with a smaller fraction of N.

In an embodiment of the invention, an object is to remove an exposed part of a carbide-silicon layer in-situ by converting at least partly said exposed part of said carbide-silicon layer into an oxide-silicon. The disclosed method comprises the steps converting at least partly said exposed part of said carbide-silicon layer into an oxide-silicon layer by exposing said carbide-silicon layer to an oxygen containing plasma and removing said oxide-silicon layer from said substrate. Said conversion step and said removal step can be subsequently repeated for a number of times until said carbide-silicon layer is substantially removed.

Said exposed part can be, but is not limited hereto, an exposed part in an opening or can be at least an exposed part of a layer.

This method can be applied in-situ. The substrate can be, but is not limited hereto, a partly processed or a pristine wafer or slice of a semi-conductive material, like Si or Ga As or Ge, or an insulating material, e.g. a glass slice, or a conductive maternal. Said substrate can comprise a patterned conductive layer. Particularly, in case said substrate is a partly processed wafer or slice; at least a part of the active and/or passive devices can already be formed and/or at least a part of the structures interconnecting these devices can be formed.

Preferably this conversion is performed at low temperatures, preferably 600° C. or below, in an oxygen-containing plasma.

For the purpose of this disclosure, plasma should be understood as a conventional plasma such as a reactive ion etch (RIE) plasma or a chemical vapour deposition (CVD) plasma, or a plasma afterglow. By exposing said carbide-silicon layer to an oxygen-containing plasma, energy is given to the oxygen containing species, such that carbide-silicon is at least partly converted into oxide-silicon. This energy can be e.g. thermal energy or kinetic energy, e.g. by the formation of ions.

In an embodiment of the invention the conversion from a part of the carbide-silicon layer to an oxide-silicon layer can be performed by exposing the carbide-silicon layer to an oxygen-containing reactive ion etch (RIE) plasma. Particularly, the substrate including the carbide-silicon layer can be introduced in a pressurized chamber of a plasma-etch tool. The pressure can be lower than 3 Torr and preferably between 1 mTorr and 1 Torr. The temperature in said chamber can be 300° C. or below; or preferably below 100° C. This temperature can also be in the range from −20° C. to 100° C. Preferably, said temperature is about room temperature. The energy of the RIE plasma can be between 1 eV and 500 eV, such that ionic species can be formed.

In another embodiment, the conversion from a part of the carbide-silicon layer to an oxide-silicon layer can be performed by exposing the carbide-silicon layer to an oxygen-containing CVD plasma. The substrate including the carbide-silicon layer can be introduced in a pressurised chamber of a chemical vapour deposition tool. The pressure can be, but is not limited hereto, higher than 5 Torr, e.g. 10 Torr. The temperature can be in the range between 250° C. and 550° C., preferably in the range between 350° C. and 500° C.

In yet another embodiment of the invention, the conversion from a part of the carbide-silicon layer to an oxide-silicon layer can be performed by exposing the carbide-silicon layer to an oxygen-containing plasma afterglow. Particularly, the substrate including the carbide-silicon layer can be introduced in a pressurised chamber of a plasma-etch tool. Said plasma afterglow can be characterised, but is not limited hereto, by a pressure in the range from 0.02 Torr to 3 Torr, and in the range between 0.2 Torr and 1.5 Torr and preferably between 0.75 Torr and 1.25 Torr, e.g. about 0.85 Torr or 1.1 Torr. The flow of the oxygen containing substance can be lower than 10000 Sccm and preferably, but not limited hereto, about 4000 Sccm.

The temperature in said chamber is preferably 600° C. or below. This temperature can also be in the range from 100 to 600° C. and also in the range from 200 to 400° C. and also in the range from 200 to 300° C. This temperature is preferably, but not limited hereto, about 230° C.

Said removal step is performed by exposing the oxide silicon layer to a wet or dry etch. Said wet etch can comprise, but is not limited hereto, diluted HF, diluted BHF or wet etchants comprising HF or BHF. Said dry etch can be a dry etch chemistry comprising a fluorine source.

In a preferred embodiment, this conversion is performed at low temperatures, preferably 600° C. or below, in an oxygen-containing plasma, particularly in a plasma afterglow. The carbide-silicon layer is exposed to an oxygen-containing plasma afterglow at a temperature of 600° C. or below. Particularly a temperature in the range from 200° C. to 400° C. can be used. In this temperature range, conversion of the exposed part of a carbide-silicon layer can be obtained through interaction of atomic oxygen or an oxygen radical or an ionic oxygen or another oxygen containing oxidising species with the carbide-silicon layer. Generation of these reactive species can be obtained by generating a plasma in appropriate gas mixtures. As an example, the oxidation of a carbide-silicon layer, particularly amorphous hydrogenated silicon carbide, obtained in the afterglow of an $O_2$-discharge is discussed below. The example is referred to as example 1 (see also FIG. 1 and FIG. 2). An oxygen containing plasma is a plasma comprising at least oxygen. An oxygen containing plasma can comprise, but is not limited hereto, at least oxygen and one of the group consisting of $N_2$, $C_xF_y$, $SF_2$, or another halogen source.

EXAMPLE 1

Afterglow Oxidation of Amorphous Hydrogenated Silicon Carbide

The carbide-silicon layers (1) (2) were formed through plasma enhanced deposition on Si wafers. Thereafter, the carbide-silicon layers (1) (2) on these wafers are submitted to an $O_2/N_2$ plasma afterglow for different times at a pressure of 1.1 Torr. The $O_2$-flow is 4000 sccm, while the $N_2$-flow is 200 sccm. The wafer temperature was maintained at about 230° C. Different samples were submitted for different process times, all in the range from 2 to 8 minutes. After oxidation, samples were etched in a 2% HP mixture for 5 minutes (4). Ellipsometric measurements were performed after deposition of the film (3), after oxidation and after wet etching (5) in the diluted HF solution.

Figure 2:
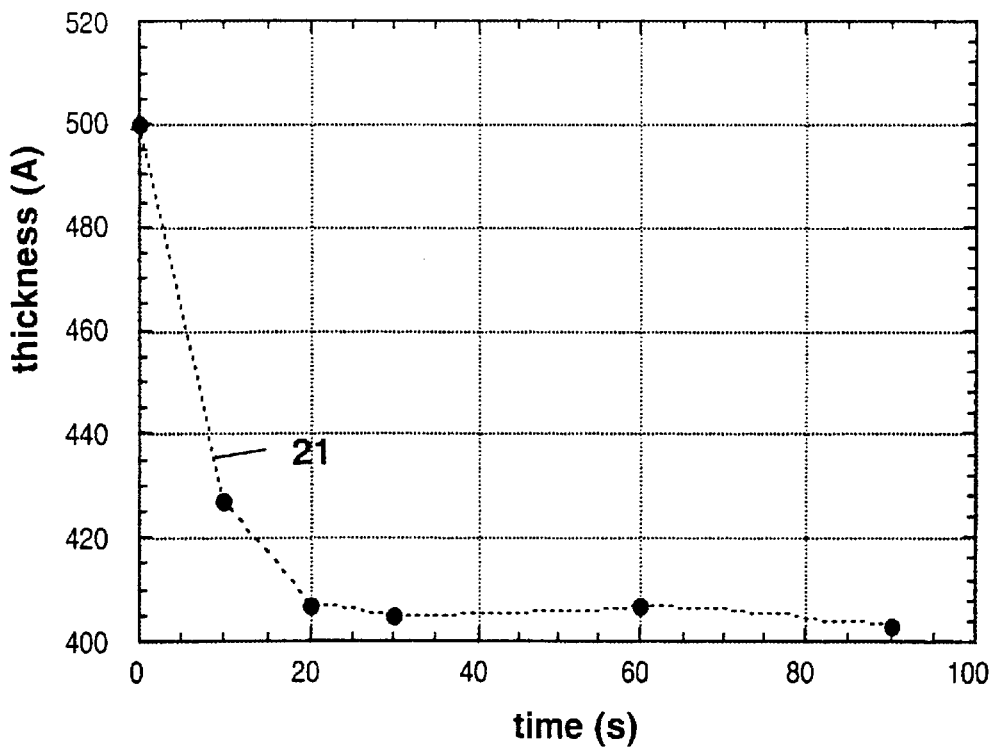
FIG. 2 depicts the thickness of a carbide-silicon layer which is partly converted into an oxide-silicon, according to an embodiment of the present invention, versus the etch time using a HF based etch solution.

From these measurements, the following observations can be made:
a. Exposure of carbide-silicon to an oxygen-containing ambient in the medium temperature range, i.e. the range from 100° C. to 600° C., converts the carbide-silicon to a material showing different optical properties
b. The change of the ellipsometric parameters depends on the exposure time.
c. The converted material can be removed in 2% HF solution
d. The amount of removed material, i.e. the thickness of the converted layer, is depending on the exposure time. More material is removed for longer plasma exposure times.
e. After removal of the converted layer, identical optical properties as for the pristine carbide-silicon are found.
f. Carbide-silicon remains substantially unaffected when subjected to a 2% HF solution (FIG. 2). FIG. 2 (21) clearly shows that the converted part of the carbide-silicon layer is removed in the first twenty seconds, while the etch process has no effect on the unconverted part of the carbide-silicon layer.

This example clearly shows the possibility of converting carbide-silicon layers to oxide-silicon layers. Dependent on the exposure times, the exposed layer of a carbide-silicon layer can be converted partly or completely. This converted layer can be removed e.g. in a HF based solution. The conversion step and the removal step are subsequently repeated for a number of times until said carbide-silicon layer is substantially removed. In case the conversion is complete, after etching the layer underlying the original carbide-silicon layer is exposed. In the latter case the removal process is selected such that it selectively removes the oxide-silicon layer at least with respect to said underlying layer.

In another embodiment of the invention, at least a part of a carbide-silicon layer is exposed to an oxygen-containing RIE plasma. Using an RIE plasma instead of a plasma afterglow can have some benefits including the possibility to perform the conversion at low temperatures, e.g. at room temperature. Moreover, besides the potential benefit of the lower temperature, the conversion can be performed anisotropically in an RIE plasma which is a huge benefit for in-situ conversion especially for fabricating interconnect and dielectric structures such as e.g. a damascene or dual-damascene metallization scheme.

Alternatively, instead of exposing carbide-silicon to an oxygen-containing plasma, one can also expose carbide-silicon to a nitrogen-containing plasma in order to convert the carbide-silicon to a nitride-silicon. At least for the purpose of this disclosure a nitride-silicon layer is a layer composed of at least Si and N, e.g. silicon nitride or of Si, N and a smaller fraction of C. In case of this nitridation, the converted carbide-silicon layer can be removed using e.g. Phosphoric acid. By doing so, the obtained $Si_3N_4$ can be removed selective both to silicon (di)oxide and silicon. This method can for instance be used in integration schemes where the carbide-silicon layers needs to be removed selective to silicon (di)oxide present on the wafer surface.

In yet another embodiment of the invention, an integrated circuit is disclosed wherein a carbide-silicon layer is used as an etch stop layer and as a diffusion barrier layer between a conductive layer and the surrounding dielectric. The conductive layer can be deposited on a semiconducting layer. The conductive layer (43) can be a pure metal or a metal alloy of the group of metals consisting of Al, Cu, W, Pt, Ac, Ni, Au, Co, Ti, Ta, or a Si-containing or other semiconductor-containing layer such as e.g. a silicide, a polysilicon or a silicon layer. This conductive layer can also be a stack of a barrier layer, conductive or not, and a metal layer.

In an embodiment of the invention, an interconnect structure on a substrate having a surface with at least one exposed Si-containing layer, particularly a PMD structure, is disclosed wherein a carbide-silicon layer is used as an etch stop layer and as a diffusion barrier layer between a silicide layer and the surrounding dielectric.

A major problem in PMD structures (see also in FIG. 3) and particularly in the definition of contact holes, i.e. openings in the (multi-layer) dielectric, extending to the silicide layer, is the selectivity towards the silicide material. Silicide layers are thin layers having a low resistivity and a low contact resistance to an adjacent silicon-containing layer as e.g. a Si substrate or a polysilicon or amorphous silicon layer.

A silicide layer comprises a compound comprising silicon and at least one of the group comprising Co, Ti, Ta, Co, Mb, Ni, Pt and W. A silicide layer can be, but is not limited hereto, a silicide-cobalt layers being defined as $Co_xSi_y$, x and y being positive numbers, e.g. $CoSi_2$, or silicon-titanium layers being defined as $Ti_xSi_y$, x and y being positive numbers, e.g. $TiSi_2$. In conventional schemes, as for instance in the silicides are used as etch stop layers during the formation of contact holes. Many schemes use bi-level contacts or multi-level contacts, putting even higher requirements onto the selectivity of the contact etch process towards the silicide. Contact etch processes may show aspect ratio dependent etch rates (slower etch rate with decreasing contact size) and thus aspect ratio dependent selectivity. Control of the selectivity for both shallow and deep contacts becomes very critical. In addition, the following trends are observed nowadays which puts even some more emphasis on this selectivity:

a) Introduction of CMP inducing non-uniformity of the dielectric and hence requiring increased over-etch time.
   b) Reduction of the silicide thickness requiring ever increasing selectivity.
   c) Introduction of shallow junctions being more sensitive for degradation effects and putting stringent requirements on the maximum allowable silicide thickness.

All of these trends require better selectivity towards silicides and in fact, for some technologies, selectivity becomes the limiting factor.

A way to address the selectivity issue is the use of a so-called etch stop layer. Such a thin etch-stop layer is deposited at least on the silicide contact layers prior to the deposition of the pre-metal dielectric stack. A typical material being used as an etch stop layer is silicon nitride. The contact etch process is set up to stop on or in the this silicon nitride layer. Afterwards, an additional etch step for controlled removal of the thin nitride layer is introduced. Advantages of this approach are the limited exposure of the silicides and/or silicon or other substrate material to the etch plasma which, in principle allows better control of substrate material loss. The introduction of an etch stop layer can overcome the etch problems related to the topography of the dielectric layers to be etched and the effect of multi-level schemes, particularly the simultaneous definition of shallow and deep contact holes. The set up of the contact etch and nitride removal process however is complicated. Dependent on the dielectrics used, the selectivity of the etch process of the dielectric towards nitride can be too limited, especially when silicon (di)oxide is used as a dielectric. Moreover, the removal of nitride selective towards silicide is even a bigger problem.

Besides the selectivity issue the etch-stop layer also has to be a good barrier layer amongst others to reduce the in-diffusion of contamination e.g. metal particles. In case silicon nitride is used as etch stop layer, then this layer needs careful optimisation towards better barrier properties and it can be expected that improvement in terms of in-diffusion of contamination will result in a more difficult etch and therefore negatively influences the selectivity issue.

Further according to this embodiment of the invention a carbide-silicon layer is introduced as an etch stop layer having excellent barrier properties. Due to its intrinsic high chemical stability it is almost impossible to remove it selectively towards silicide. However due to the conversion method of the present convention it can be converted in-situ at sufficient low temperature in an oxide-silicon, which on its turn can be easily removed selectively towards the silicide. For a typical oxide etch process (e.g. $CF_4/CHF_3$), the selectivity of oxide etch towards SiC is better than the selectivity towards nitride. For less standard chemistries, the same behaviour has been demonstrated. In addition, the selectivity of oxide etch towards silicide is better than the selectivity of nitride etch towards silicide.

Figure 3:
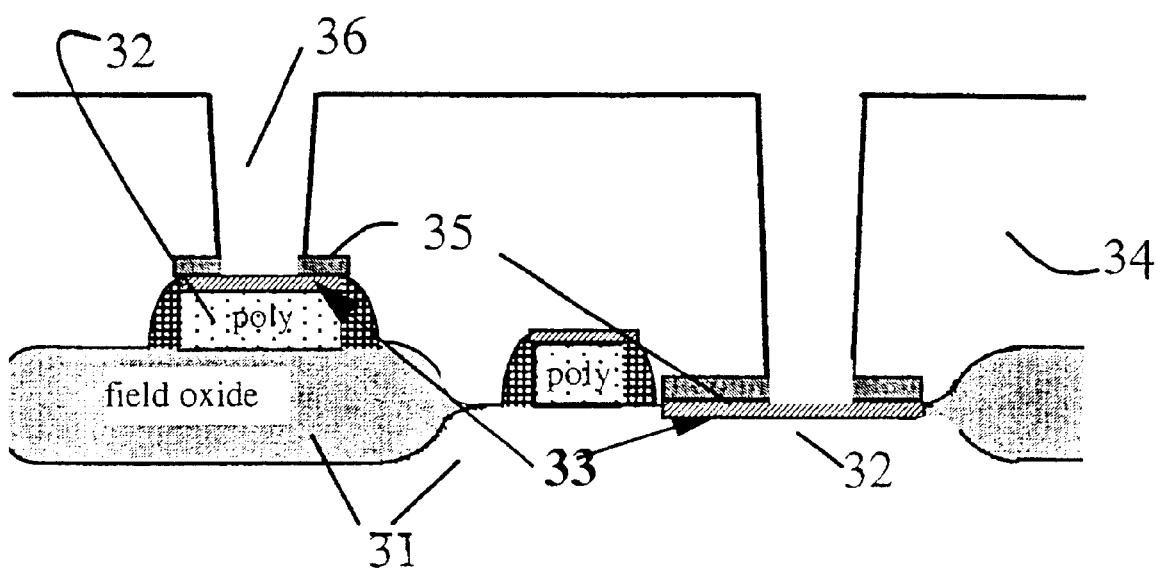
FIG. 3 depicts a schematic representation of a pre-metal dielectric structure according to an embodiment of the invention.

In FIG. 3 an interconnect structure on a substrate (31) having a surface with at least one exposed Si-containing layer (32), particularly a PMD structure, is disclosed. An exposed Si-containing layer can be a Si-containing substrate layer (32), such as e.g. a source, a drain or a collector region, or a polysilicon or amorphous silicon region, such as e.g. a gate region or an extrinsic emitter or base region. The substrate can be a partly processed or a pristine wafer or slice of a semiconductive material, like Si or GaAs or Ge, or an insulating material, e.g. a glass slice. Said substrate can comprise a patterned dielectric layer and/or a patterned amorphous silicon or polysilicon layer. Particularly, in case said substrate is a partly processed wafer or slice; at least a part of the active and/or passive devices can already be formed.

This PMD structure further comprises:
   a silicide layer (33) on said exposed Si-containing layer;
   at least ore dielectric layer (34) on said surface of said substrate having at least one opening (36), said opening extending through said dielectric layer to thereby define an exposed part of said silicide layer; and
   a carbide-silicon layer (35) being formed at least on said silicide layer and being positioned between said dielectric layer and said silicide layer adjacent to said exposed part of said silicide layer.

A dielectric layer can be a ceramic silicon oxide, nitride or oxynitride layer, fluorinated or not, or an organic polymer layer selected from the group consisting of the benzocyclobutarenes, i.e. benzocyclobutene (BCB) commercially available as Cyclotene 5021™, poly arylene ether, i.e. FLARE™ II, aromatic hydrocarbon, i.e. SILK™, and polyimides. Such an organic polymer layer can be in-situ fluorinated. Also porous (inorganic) dielectric layers can be used as for instance e.g. the xerogels.

Typical examples of silicides are silicides of a refractory metal such as Ti, Ta, Co, Mb, Ni and Pt.

Figure 4:
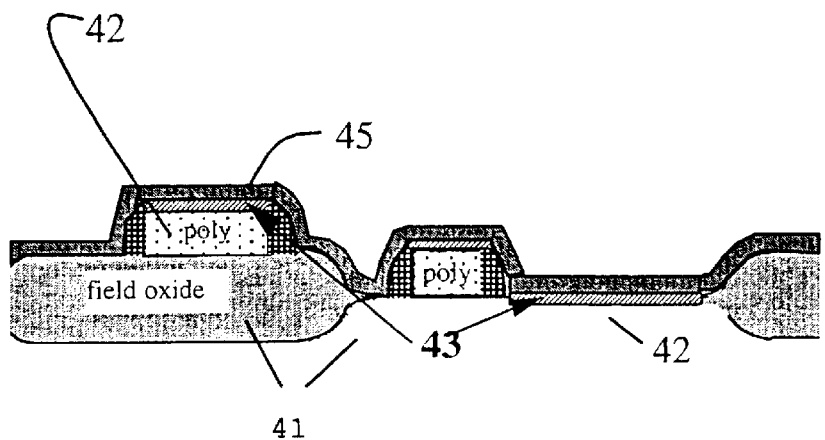
FIG. 4 depicts some processing steps applied to obtain a pre-metal dielectric structure according to an embodiment of the invention.
Figure 4:
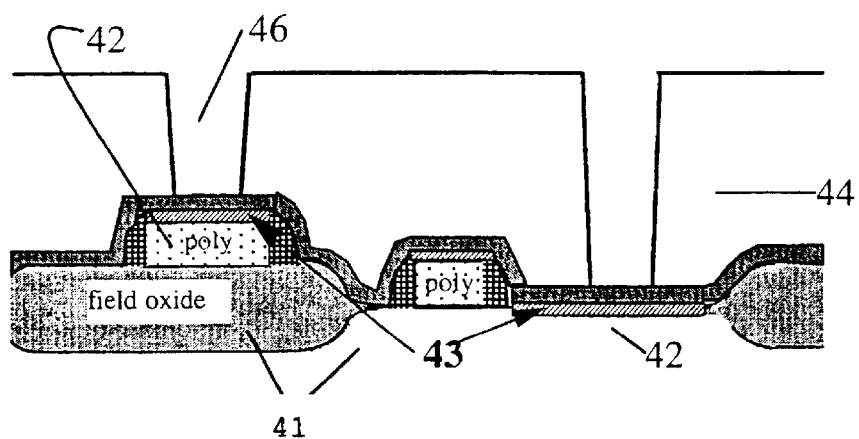
Figure 4:
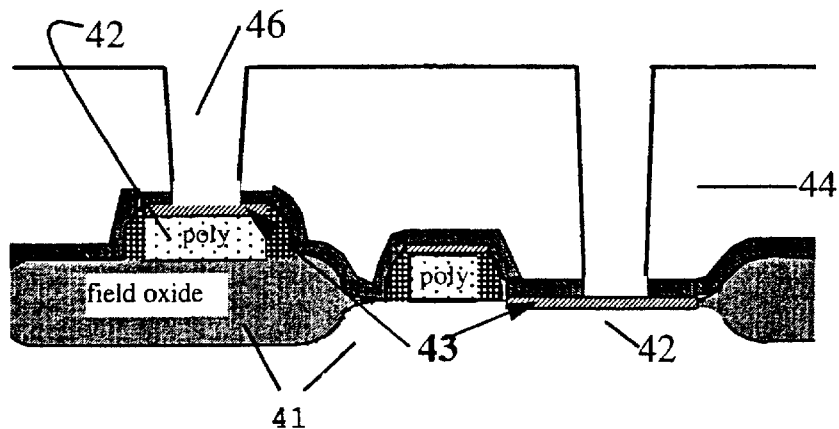

In FIG. 4, according to a further embodiment of the invention, some of the process steps to obtain an interconnect structure, including a PMD structure and inter or intra metal structures (IMD), are depicted:

a) As a first process step (step a)), a carbide-silicon layer (45) with a thickness of typically about 50 nm is deposited on a substrate (41), i.e. at least on the exposed conductive layers (42). Preferably however, a blanket deposition of this insulating carbide-silicon layer is performed. This carbide-silicon layer which is at the same time an etch-stop layer and a barrier layer prevents the in-diffusion of contamination. The conductive layer (43) can be a pure metal or a metal alloy of the group of metals consisting of Al, Cu, W, Pt, Ag, Ni, Au, Co, Ti, Ta, or a Si-containing or other semiconductor-containing layer such as e.g. a silicide, a polysilicon or a silicon layer. This conductive layer can also be a stack of a barrier layer, conductive or not, and a metal layer. The substrate can be a partly processed or a pristine wafer or slice of a semi-conductive material, like Si or Ga As or Ge, or SiGe or an insulating material, e.g. a glass slice, or a conductive material. Said substrate comprises a (patterned) conductive layer. Particularly, in case said substrate is a partly processed wafer or slice; at least a part of the active and/or passive devices can already be formed and/or at least a part of the structures interconnecting these devices can be formed;
   b) After the deposition of the carbide-silicon layer, at least one dielectric layer (44) is formed thereon. Then, at least one opening is formed (step b)) in the dielectric layer(s) extending through the dielectric layer(s) to thereby expose a part of the carbide-silicon layer formed on the conductive layer. This opening is formed preferably using a dry etch sequence using at least a patterned resist layer on top the dielectric layers as a mask. Because the carbide-silicon acts as an etch-stop layer, there is a large process window available for this contact etch process;

c) The exposed part of the carbide-silicon layer in the opening can now be at least partly converted in-situ into oxide-silicon by exposure to an oxygen-containing plasma; and d) Thereafter, the oxide-silicon layer in said opening (and simultaneously the resist) can be removed selectively. The sequence of steps c) and d) can be executed repeatedly till the underlying conductive layer is exposed.

There are several alternatives possible for this sequence of steps a) to d). The invention is in no way restricted to this particular sequence.

As a first alternative one can opt for a complete conversion of the carbide-silicon (step c)). In this case, the oxide-silicon layer can be removed selectively to said conductive layer to thereby expose a part of said conductive layer.

As a further alternative, prior to the conversion of the carbide-silicon (step c)), a barrier layer can be formed at least on the side walls of the openings in the dielectric layers(s) to protect the dielectric stack. In case the subsequent conversion/removal of the carbide silicon is executed by means of exposure in an anisotropic oxygen-containing RIE, plasma, then one can also opt for a carbide-silicon layer as barrier layer on the side walls of the openings.

EXAMPLE 2

An Exemplary Processing Scheme Further According to the Method of the Present Invention First a SiC layer is deposited on a Si-wafer comprising patterned oxide layers and exposed conductive layers of $TiSi_2$ directly on the Si wafer and of $TiSi_2$ on patterned polysilicon layers. Then oxide layers are deposited defining a dielectric stack. A resist is formed and patterned atop this dielectric stack. Next the Si-wafer is introduced in an oxide etch chamber for the contact etch defining the openings in the oxide stack. The etch stops on the SiC layer. The exposed part of the SiC layer is in-situ converted into silicon dioxide using a low temperature oxygen-containing plasma afterglow, while at the same time the resist is removed. The same oxide etch chamber is used. Finally, the converted SiC, i.e. the silicon dioxide is removed selectively towards the $TiSi_2$ in the same oxide etch chamber. Some advantages of using SiC instead of e.g. silicon nitride include: full in-situ processing, reduced silicide loss, good contact resistance and yield since standard chemistry can be used, and improved barrier properties. SiC can be used in this processing scheme as alternative material towards nitride.

What is claimed is:

1. A method for fabricating an integrated circuit on a substrate having a surface with at least one conductive layer on a semiconducting layer comprising the steps of:

forming a carbide-silicon layer on top of at least said conductive layer, depositing at least one dielectric layer on, at least said carbide-silicon layer, forming at least one opening in said dielectric layer extending through said dielectric layer to expose a part of said carbide-silicon layer formed on said conductive layer, converting at least partly said exposed part of said carbide-silicon layer in said opening into a silicon-oxygen layer by exposing said part of said carbide-silicon layer in said opening to an oxygen-containing plasma, and removing said oxide-silicon layer in said opening.

2. The method as recited in claim 1, wherein said conductive layer is a silicide layer.

3. The silicide layer as recited in claim 2, wherein said silicide is a compound comprising silicon and at least one of the group comprising Co, Ti, Ta, Co, Mb, Ni, Pt and W.

4. The method as recited in claim 1, wherein said conductive layer is one of the group consisting of a polysilicon layer and an amorphous silicon layer.

5. The method as recited in claim 1, wherein said conversion step and said removal step are subsequently repeated for a number of times until at least a part of said conductive layer is exposed.

6. The method as recited in claim 1, wherein said carbide-silicon layer comprises at least on of the group consisting of silicon carbide, silicon oxycarbide, nitrided silicon carbide, nitrided silicon oxycarbide, hydrogenated silicon carbide, hydrogenated silicon oxycarbide, hydrogenated nitrided silicon carbide and hydrogenated nitrided silicon oxycarbide.

7. The method as recited in claim 1, wherein said oxide-silicon layer comprises at least one of the group consisting of silicon dioxide, silicon dioxide with a smaller fraction of C, silicon dioxide with a smaller fraction of N and C, silicon dioxide with a smaller fraction of N, hydrogenated silicon dioxide, hydrogenated silicon dioxide with a smaller fraction of C, hydrogenated silicon dioxide with a smaller fraction of N and C and hydrogenated silicon dioxide with a smaller fraction of N.

8. The method as recited in claim 2, wherein said conversion step and said removal step are subsequently repeated for a number of times until at least a part of said conductive layer is exposed.

9. The method as recited in claim 3, wherein said conversion step and said removal step are subsequently repeated for a number of times until at least a part of said conductive layer is exposed.

10. The method as recited in claim 4, wherein said conversion step and said removal step are subsequently repeated for a number of times until at least a part of said conductive layer is exposed.

11. The method as recited in claim 2, wherein said carbide-silicon layer comprises at least on of the group consisting of silicon carbide, silicon oxycarbide, nitrided silicon carbide, nitrided silicon oxycarbide, hydrogenated silicon carbide, hydrogenated silicon oxycarbide, hydrogenated nitrided silicon carbide and hydrogenated nitrided silicon oxycarbide.

12. The method as recited in claim 3, wherein said carbide-silicon layer comprises at least on of the group consisting of silicon carbide, silicon oxycarbide, nitrided silicon carbide, nitrided silicon oxycarbide, hydrogenated silicon carbide, hydrogenated silicon oxycarbide, hydrogenated nitrided silicon carbide and hydrogenated nitrided silicon oxycarbide.

13. The method as recited in claim 4, wherein said carbide-silicon layer comprises at least on of the group consisting of silicon carbide, silicon oxycarbide, nitrided silicon carbide, nitrided silicon oxycarbide, hydrogenated silicon carbide, hydrogenated silicon oxycarbide, hydrogenated nitrided silicon carbide and hydrogenated nitrided silicon oxycarbide.

14. The method as recited in claim 5, wherein said carbide-silicon layer comprises at least on of the group consisting of silicon carbide, silicon oxycarbide, nitrided silicon carbide, nitrided silicon oxycarbide, hydrogenated silicon carbide, hydrogenated silicon oxycarbide, hydrogenated nitrided silicon carbide and hydrogenated nitrided silicon oxycarbide.

15. The method as recited in claim 2, wherein said oxide-silicon layer comprises at least one of the group consisting of silicon dioxide, silicon dioxide with a smaller fraction of C, silicon dioxide with a smaller fraction of N and C, silicon dioxide with a smaller fraction of N, hydrogenated silicon dioxide, hydrogenated silicon dioxide with a smaller fraction of C, hydrogenated silicon dioxide with a smaller fraction of N and C and hydrogenated silicon dioxide with a smaller fraction of N.

16. The method as recited in claim 3, wherein said oxide-silicon layer comprises at least one of the group consisting of silicon dioxide, silicon dioxide with a smaller fraction of C, silicon dioxide with a smaller fraction of N and C, silicon dioxide with a smaller fraction of N, hydrogenated silicon dioxide, hydrogenated silicon dioxide with a smaller fraction of C, hydrogenated silicon dioxide with a smaller fraction of N and C and hydrogenated silicon dioxide with a smaller fraction of N.

17. The method as recited in claim 4, wherein said oxide-silicon layer comprises at least one of the group consisting of silicon dioxide, silicon dioxide with a smaller fraction of C, silicon dioxide with a smaller fraction of N and C, silicon dioxide with a smaller fraction of N, hydrogenated silicon dioxide, hydrogenated silicon dioxide with a smaller fraction of C, hydrogenated silicon dioxide with a smaller fraction of N and C and hydrogenated silicon dioxide with a smaller fraction of N.

18. The method as recited in claim 5, wherein said oxide-silicon layer comprises at least one of the group consisting of silicon dioxide, silicon dioxide with a smaller fraction of C, silicon dioxide with a smaller fraction of N and C, silicon dioxide with a smaller fraction of N, hydrogenated silicon dioxide, hydrogenated silicon dioxide with a smaller fraction of C, hydrogenated silicon dioxide with a smaller fraction of N and C and hydrogenated silicon dioxide with a smaller fraction of N.

19. The method as recited in claim 6, wherein said oxide-silicon layer comprises at least one of the group consisting of silicon dioxide, silicon dioxide with a smaller fraction of C, silicon dioxide with a smaller fraction of N and C, silicon dioxide with a smaller fraction of N, hydrogenated silicon dioxide, hydrogenated silicon dioxide with a smaller fraction of C, hydrogenated silicon dioxide with a smaller fraction of N and C and hydrogenated silicon dioxide with a smaller fraction of N.

\* \* \* \* \*

UNITED STATES PATENT AND TRADEMARK OFFICE
CERTIFICATE OF CORRECTION

PATENT NO.    : 6,599,814 B1
DATED         : July 29, 2003
INVENTOR(S)   : Serge Vanhaelemeersch, Herman Meynen and Philip D. Dembowski It is certified that error appears in the above-identified patent and that said Letters Patent is hereby corrected as shown below:

Column 1,
Line 57, replace "fits" with -- its --;

Column 2,
Line 66, replace "paritly" with -- partly --;

Column 3,
Line 5, replace "De" with -- be --;
Line 31, replace "laver" with -- layer --;

Column 5,
Line 32, replace "SINC" with -- SiNC --;
Line 33, replace "SINOC" with -- SiNOC --;

Column 6,
Line 3, replace "maternal" wiuth -- material --;

Column 8,
Line 39, replace "Ac" with -- Ag --; and

Column 11,
Line 60, replace "on,at" with -- on at --.

Column 12,
Lines 18, 45, 52, 59 and 66, replace "on" with -- one --.

Signed and Sealed this

Eleventh Day of May, 2004

JON W. DUDAS
*Acting Director of the United States Patent and Trademark Office*